US009229460B1

(12) United States Patent
Testi et al.

(10) Patent No.: US 9,229,460 B1
(45) Date of Patent: Jan. 5, 2016

(54) RADIO FREQUENCY PEAK DETECTION WITH SUBTHRESHOLD BIASING

(71) Applicant: Innophase Inc., Chicago, IL (US)

(72) Inventors: Nicolo Testi, Chicago, IL (US); Xi Li, Chicago, IL (US); Yang Xu, Chicago, IL (US)

(73) Assignee: INNOPHASE INC., Chicago, IL (US)

( * ) Notice: Subject to any disclaimer, the term of this patent is extended or adjusted under 35 U.S.C. 154(b) by 0 days.

(21) Appl. No.: 14/321,299

(22) Filed: Jul. 1, 2014

(51) Int. Cl.
*G01R 19/00* (2006.01)
*G05F 1/46* (2006.01)
*H03H 11/04* (2006.01)
*H03K 3/012* (2006.01)

(52) U.S. Cl.
CPC ................. *G05F 1/46* (2013.01); *H03H 11/04* (2013.01); *H03K 3/012* (2013.01)

(58) Field of Classification Search
CPC ........ G01R 19/04; H03K 5/1532; H04B 1/22; H04B 1/24
See application file for complete search history.

(56) References Cited

U.S. PATENT DOCUMENTS 7,696,791 B2 * 4/2010 Hyvonen ........................ 327/71
7,759,983 B2 * 7/2010 Carrara et al. .................. 327/77
8,310,277 B2 * 11/2012 Su et al. .......................... 327/58
2014/0084995 A1 3/2014 Hadji-Abdolhamid et al.

OTHER PUBLICATIONS

Chaoming Zhang, et al., Built-In Test of RF Mixers Using RF Amplitude Detectors, IEEE, Proceedings of the 8th International Symposium on Quality Electronic Design, 2007.

* cited by examiner

*Primary Examiner* — Jeffrey Zweizig
(74) *Attorney, Agent, or Firm* — Invention Mine LLC

(57) ABSTRACT

A radio-frequency peak amplitude detection circuit includes a load capacitor, a current source that charges the load capacitor and set the bias current for the field effect transistors, and a pair of field effect transistors. The gates of the field effect transistors are biased at a level below the threshold voltage of the transistors. The transistors are arranged in parallel with the capacitor and are operable to drain the capacitor at a rate determined by a differential input at the gates of the transistors. The voltage across the load capacitor is low-pass filtered and has a voltage level representative of the amplitude of the differential input signal.

20 Claims, 2 Drawing Sheets

RADIO FREQUENCY PEAK DETECTION WITH SUBTHRESHOLD BIASING

BACKGROUND OF THE INVENTION

Communications transceivers may utilize numerous architectures to recover data from a modulated carrier signal. These architectures include coherent demodulation, using either intermediate frequency conversion or direct-conversion receivers. Such receivers typically recover or regenerate the communications carrier signal using a phase-locked loop (PLL) and coherent demodulation. Recently, polar receiver architectures have been proposed that extract the modulation phase components from a received modulated signal without using a carrier recovery circuitry. However, the proposed polar receiver architectures and associated signal processing have deficiencies that result in poor performance and high bit error rates (BER). Accordingly, there is a need for improved polar receiver signal processing and architectures.

Various signal processing architectures often make use of peak detectors to measure the peak level of a radio frequency signal. However, such detectors frequently require the use of a relatively high signal input level. For example, the amplitude detector disclosed by C. Zhang, R. Gharpurey, and J. A. Abraham, "Built-In Test of RF Mixers Using RF Amplitude Detectors," IEEE ISQUED, 2007, requires an input signal amplitude of at least around 100 mV. For wireless receiver applications, a signal of that level can often be achieved only with the use of an additional amplifier to amplify the input of the peak detector. However, the use of an amplifier can lead to undesirably high levels of power consumption.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

DETAILED DESCRIPTION OF THE INVENTION

Figure 1:
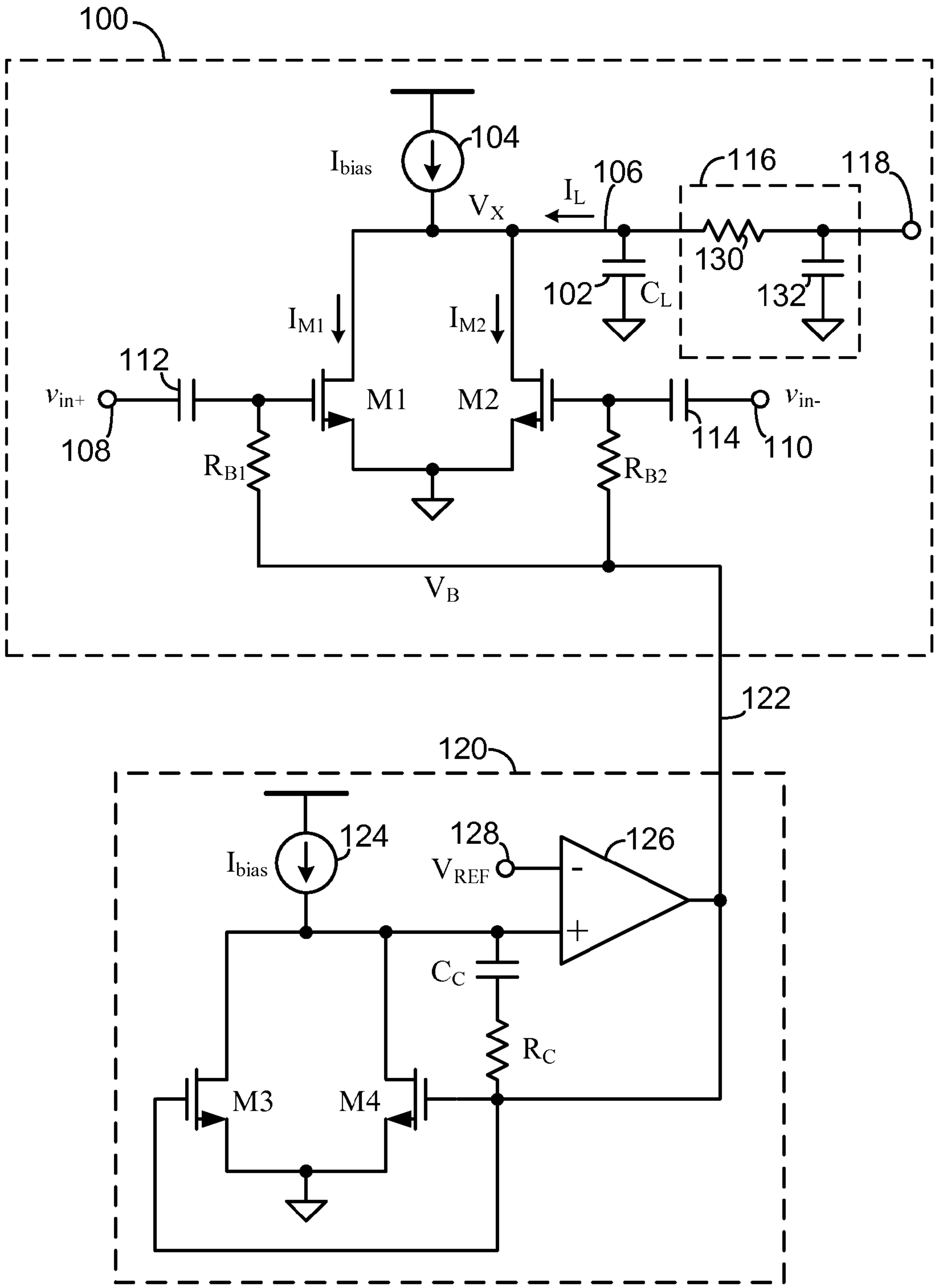
FIG. 1 is a schematic circuit diagram of a peak detector in accordance with some embodiments.

With reference to FIG. 1, a peak detection circuit 100 includes a load capacitor 102 with capacitance $C_L$. The load capacitor 102 is connected between a common node 106 and ground. A current source 104 is connected to the common node 106 and operates to supply a current $I_{bias}$ to charge the load capacitor 102 and set the correct bias current for transistors M1 and M2. The peak detection circuit 100 includes a first field effect transistor M1 and a second field effect transistor M2. The field effect transistors M1 and M2 may be insulated-gate transistors such as MOSFET transistors. Transistors M1 and M2 preferably have matched electrical characteristics and physical size. For example, transistors M1 and M2 preferably have substantially the same length and width, and same values of the threshold voltage $V_{th}$, and the slope factor n, where $n=1+C_D/C_{OX}$, with $C_D$ being the capacitance of the depletion layer and $C_{OX}$ being the capacitance of the insulating layer.

The channels of transistors M1 and M2 are arranged between the common node 106 and ground. The channels of transistors M1 and M2 are thus arranged in parallel with each other and in parallel with the load capacitor 102.

How the current is divided between the channels of transistors M1 and M2 is controlled by respective gates of those transistors. The gate of transistor M1 is coupled to a first differential input node 108 through a first capacitive coupling 112, and the gate of transistor M2 is coupled to a second differential input node 110 through a second capacitive coupling 114. Because the channels of the transistors M1 and M2 are arranged in parallel with the load capacitor 102, the load capacitor 102 is permitted to discharge through the channels of transistors M1 and M2 at a rate determined by the voltage level at the gates of the transistors M1 and M2.

A low-pass filter 116 is connected between the load capacitor 102 and an output node 118. The low-pass filter 116 may be an RC (resistor-capacitor) circuit that includes a series resistor 130 and a parallel capacitor 132. Other types of low-pass filter may also be implemented.

The gates of the transistors M1 and M2 are biased by the output of a biasing circuit 120. The biasing circuit is operative to provide a biasing voltage $V_B$ that is lower than the threshold voltage $V_{th}$ of the first and second transistors M1 and M2. The biasing circuit 120 has a bias output node 122 that is connected to the gates of transistors M1 and M2 through, respectively, bias resistors $R_{B1}$ and $R_{B2}$.

The biasing circuit 120 includes a third field-effect transistor M3 and a fourth field effect transistor M4. The transistors M3 and M4 preferably have electrical characteristics that are matched with the characteristics of transistors M1 and M2. That is, the physical size (length and width), the threshold voltage $V_{th}$, and the slope factor n, preferably have substantially the same values for all four transistors M1, M2, M3, and M4. The gates of the third and fourth transistors M3 and M4 are connected to the bias output node 122. The channels of the transistors M3 and M4 are connected in parallel with each other.

The biasing circuit 120 further includes a current source 124, which is configured to provide substantially the same current $I_{bias}$ as the current provided by the current source 104. The current source 124 provides the current $I_{bias}$ through the channels of transistors M3 and M4. A comparator circuit 126 is operative to apply a voltage to the bias output node 122. The comparator circuit 126 is responsive to a voltage level across the channels of the third and fourth transistors. In some embodiments, the comparator circuit 126 is implemented with a differential operational amplifier that has a first amplifier input connected to a reference voltage source 128 and a second amplifier input connected between the current source 124 and the channels of the third and fourth transistors M3 and M4.

The first amplifier input connected to the reference voltage source 128 is an inverting input, and the second amplifier input connected between the current source 124 and the channels of the third and fourth transistors M3 and M4 is a non-inverting input. If the voltage across the channels of the third and fourth transistors M3 and M4 rises above the reference voltage $V_{REF}$, then the operational amplifier 126 increases the output voltage on the bias output node 122. This, in turn, increases the voltage at the gates of transistors M3 and M4 and thereby lowers the voltage drop across the channels of those transistors. Conversely, if the voltage across the channels of the third and fourth transistors M3 and M4 falls below the reference voltage $V_{REF}$, then the operational amplifier 126 decreases the output voltage on the bias output node 122. This, in turn, decreases the voltage at the gates of transistors M3 and M4 and thereby raises the voltage drop across the channels of those transistors. In this way the comparator circuit 126 operates to keep the voltage drop across the channels of the third and fourth transistors M3 and M4 at the same level as the reference voltage $V_{REF}$. A resistor $R_c$ and capacitor $C_c$ form a compensation circuit to ensure the stability of the feedback.

Where the electrical characteristics of transistors M1, M2, M3, and M4 are matched, and where the current $I_{bias}$ is the same at both current source 104 and current source 124, then the voltage across the channels of M1 and M2 will be the same as the voltage across the channels of M3 and M4. That is, the voltage $V_X$ at common node 106 will mirror the voltage $V_{REF}$ supplied to the biasing circuit 120 in the absence of an input signal.

In the peak detection circuit 100, the first and second transistors M1 and M2 each have a first end, which may be a drain terminal, and a second end, which may be a source terminal. The load capacitor 102 likewise has a first terminal and a second terminal. In the embodiment of FIG. 1, the drain terminals of M1 and M2 are both attached to the common node 106, as is one of the terminals of the load capacitor 102. Also, the source terminals of M1 and M2 are both attached to ground, as is the other terminal of the load capacitor 102.

The peak detection circuit 100 operates according to the following principles to provide an output representative of the peak radio frequency amplitude. Suppose that a radio-frequency differential input signal is applied to the signal input nodes 108 and 110, and that the signal can be represented by the following equations:

$$v_{in+}=A\cdot\sin(\omega t),$$

$$v_{in-}=-A\cdot\sin(\omega t).$$

The gates of transistors M1 and M2 are biased at a level below the threshold voltage $V_{th}$. The current $I_M$ of each transistors M1 and M2 in the sub-threshold region is described to a reasonable approximation by the following equation:

$$I_M = I_0 e^{\frac{V_{gs}-V_{th}}{nV_T}},$$

where $I_0$ is the reverse saturation current, $V_{gs}$ is the gate-source voltage of the transistor, $V_{th}$ is the threshold voltage of the transistor, n is parameter determined by the doping of the transistor bulk and the oxide capacitor, and $V_T$ is the thermal voltage.

Absent an input signal, in a steady-state condition, the sum of the current of M1 and M2 is equal to the bias current $I_{bias}$:

$$I_{bias} = I_{M1} + I_{M2} = 2I_0 e^{\frac{V_B-V_{th}}{nV_T}}.$$

When an alternating-current (AC) input is injected into the circuit:

$$V_{gs1}=V_B+v_{in+}=V_B+A\cdot\sin(\omega t),$$

$$V_{gs2}=V_B+v_{in-}=V_B-A\cdot\sin(\omega t).$$

Remembering the Taylor expansion for ex:

$$e^x = 1 + x + \frac{x^2}{2} + \frac{x^3}{6} + \dots ,$$

the sum of the current of M1 and M2 becomes, to a second-order approximation, $$I_{M1} + I_{M2} = I_0 e^{\frac{V_B-V_{th}}{nV_T}}\left(e^{\frac{A\cdot\sin(\omega t)}{nV_T}} + e^{\frac{-A\cdot\sin(\omega t)}{nV_T}}\right) = I_0 e^{\frac{V_B-V_{th}}{nV_T}}\left(2 + \frac{A^2\cdot\sin^2(\omega t)}{(nV_T)^2}\right).$$

So the load current $I_L$ is:

$$I_L = I_{M1} + I_{M2} - I_{bias} = \frac{I_0 e^{\frac{V_B-V_{th}}{nV_T}}}{(nV_T)^2}A^2\sin^2(\omega t) = \frac{I_0 e^{\frac{V_B-V_{th}}{nV_T}}}{(nV_T)^2}A^2[1-\cos^2(\omega t)].$$

As seen from this equation, the net current discharging the load capacitor is proportional to the square of the amplitude of the differential input signal. Assuming the resistor of the RC filter is large enough to isolate the circuit connected after the peak detector, the voltage $V_X$ at the common node 106 is $$V_X = V_{REF} - I_L\frac{1}{sC_L} = V_{REF} - \frac{I_0 e^{\frac{V_B-V_{th}}{nV_T}}}{(nV_T)^2}A^2[1-\cos^2(\omega t)]\frac{1}{sC_L}.$$

The time constant of the RC filter is set low enough to eliminate the undesired AC component at the output. In that way, the voltage $V_{OUT}$ at the output node 118 becomes a constant value representative of the amplitude of the radio-frequency input signal. The higher the input amplitude is, the lower the output voltage will be compared to the initial bias point.

$$V_{OUT} = V_{REF} - A^2\frac{I_0 e^{\frac{V_B-V_{th}}{nV_T}}}{(nV_T)^2}\frac{1}{sC_L}.$$

In the absence of an input signal, voltage $V_X$ at the common node 106 mirrors the reference voltage $V_{REF}$, and in the steady state, the filtered output voltage $V_{OUT}$ will have this same value. As noted above, the introduction of a signal at the differential input nodes causes the values of $V_X$ and $V_{OUT}$ to drop. However, those values cannot drop below ground. Thus, the reference voltage $V_{REF}$ is selected to permit sufficient dynamic range for the expected uses of the circuit. For example, where the output voltage $V_{OUT}$ will be provided to an analog-to-digital converter, the value of $V_{REF}$ may be selected to represent the highest voltage level readable by the analog-to-digital converter. It should be noted that the mirroring by $V_X$ of the reference voltage $V_{REF}$ is not necessarily exact and may vary due to, for example, mismatch between the properties of the transistors M1, M2, M3, M4 and in the current sources 104 and 124 due to the fabrication process. The value of $V_{REF}$ can be adjusted accordingly to bring the quiescent level of $V_X$ to the desired value.

The physical sizes of the transistors M1, M2, M3, and M4 are selected such that the bias voltage $V_B$ is maintained at a level below the threshold voltages of those transistors when the current $I_{bias}$ is provided. This is done because, for a given current, the small signal transconductance of transistors in the sub-threshold region is larger than the transconductance the transistors would have in the saturation region.

A peak detection circuit as describe herein is sensitive to radio frequency inputs with amplitudes of less than around 10 mV, whereas signal amplitudes of around at least 100 mV would be required for a peak detection circuit with transistors biased in the saturation region.

Figure 2:
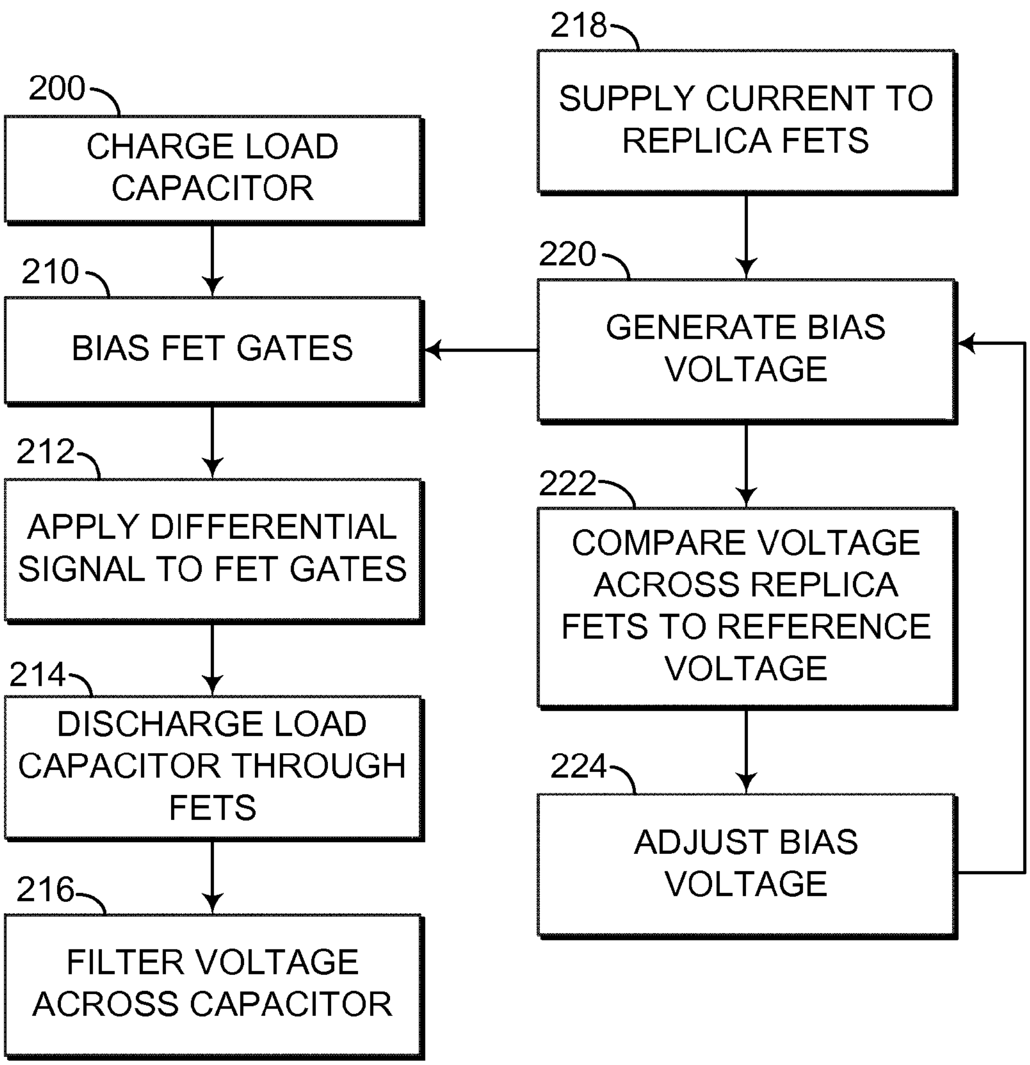
FIG. 2 is a schematic flow diagram illustrating the operation of a peak detector in accordance with some embodiments.

FIG. 2 illustrates the operation of a peak detection circuit with the use of a flow chart. It should be understood that the functions illustrated in FIG. 2 can be, and generally are, performed simultaneously. The arrows depicted in FIG. 2, thus illustrate logical relationships among functions, rather than a chronological sequence of steps.

Block 200 illustrates the charging of the load capacitor, performed by, for example, current source 104 of FIG. 1. The load capacitor is capable of being discharged through the channels of field effect transistors, such as the first and second transistors M1 and M2 of FIG. 1. As illustrated in block 210, the gates of these field effect transistors are biased, preferably at a bias voltage below the threshold voltage of the transistors.

As illustrated in block 212, a differential signal, such as a differential radio-frequency signal, is applied to the gates of the transistors, and in block 214, the load capacitor at least partially discharges through the channels of the field effect transistors at a rate determined by the differential signal applied the gates of the transistors. In a preferred embodiment, the discharging through the gates of the transistors is performed simultaneously with the charging from the current source. Thus, the net amount of charge supplied to or removed from the load capacitor depends on the difference between the rates of charging and discharging. As reflected in the equations given above, the net rate of change in the charge of the load capacitor is proportional to the square of the amplitude of the differential signal.

The level of charge at the load capacitor, and thus the voltage across the load capacitor, includes a radio-frequency AC component. At block 216, the voltage across the load capacitor is low-pass filtered to generate an output signal representative of the amplitude of the differential input signal.

The flow chart of FIG. 2 further illustrates the processes involved with the generation of a bias voltage. At block 218, current is applied across the channels of replica field-effect transistors, such as the third and fourth transistors M3 and M4 of FIG. 1, which replicate the electrical and physical properties of the first and second transistors. In block 220, a bias voltage is generated based on the voltage level across the channels of the replica transistors. The operation of block 220 may be implemented by an operational amplifier such as the amplifier 126 of FIG. 1. As noted above, the generated bias voltage is provided (block 210) to the gates of the transistors in the peak detection circuit.

In block 222, the voltage across the replica transistors is compared with a reference voltage, and in block 224, the biasing voltage is adjusted such that the voltage across the channels of the replica transistors matches the reference voltage. Specifically, in response to a determination that the voltage across the channels of the replica transistors is higher than the reference voltage, the biasing voltage is increased. Conversely, in response to a determination that the voltage across the channels of the replica transistors is lower than the reference voltage, the biasing voltage is decreased. The adjustment of the biasing voltage preferably reaches a steady state such that the voltage across the channels of the replica transistors does not substantially vary from the reference voltage.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms “comprises,” “comprising,” “has”, “having,” “includes”, “including,” “contains”, “containing” or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by “comprises . . . a”, “has . . . a”, “includes . . . a”, “contains . . . a” does not, without more constraints, preclude the existence of additional identical elements in the process, method, article, or apparatus that comprises, has, includes, contains the element. The terms “a” and “an” are defined as one or more unless explicitly stated otherwise herein. The terms “substantially”, “essentially”, “approximately”, “about” or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term “coupled” as used herein is defined as connected, although not necessarily directly and not necessarily mechanically. A device or structure that is “configured” in a certain way is configured in at least that way, but may also be configured in ways that are not listed.

It will be appreciated that some embodiments may be comprised of one or more generic or specialized processors (or “processing devices”) such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A circuit comprising:

a load capacitor;

a first and a second field effect transistor, each transistor having a channel and a gate, the gate of the first transistor being coupled to a first input node and the gate of the second transistor being coupled to a second input node, the channels of the first and second field effect transistors being arranged in parallel with the load capacitor;

a first current source operative to charge the load capacitor and to set a bias current for the field effect transistors;

a low-pass filter connected between the load capacitor and an output node; and a biasing circuit connected to the gates of the first and second transistors, the biasing circuit being operative to provide a biasing voltage lower than a threshold voltage of the first and second transistors.

2. The circuit of claim 1, wherein the biasing circuit comprises:

a third and a fourth field effect transistor, each transistor having a channel and a gate;

a bias output node connected to the gates of the first, second, third, and fourth transistors;

a second current source operative to supply a current to the channels of the third and fourth transistors; and a comparator circuit operative to apply a voltage to the bias output node, the comparator circuit being responsive to a voltage level across the channels of the third and fourth transistors.

3. The circuit of claim 2, wherein the comparator circuit comprises a differential operational amplifier having a first amplifier input connected to a reference voltage source and a second amplifier input connected between the second current source and channels of the third and fourth transistors.

4. The circuit of claim 3, wherein the first amplifier input is an inverting input and the second amplifier input is a non-inverting input.

5. The circuit of claim 1, wherein each of the transistor channels has a first end and a second end, and the load capacitor has a first terminal and a second terminal, wherein:

the first ends of the channels and the first terminal of the load capacitor are connected to a common node; and the second ends of the channels and the second terminal of the load capacitor are connected to ground.

6. The circuit of claim 5, wherein the current source is connected to the common node.

7. The circuit of claim 5, wherein the first ends of the channels are drain terminals of the respective transistors and the second ends of the channels are source terminals of the respective transistors.

8. The circuit of claim 1, wherein the low-pass filter is an RC filter comprising a series resistor and a parallel capacitor.

9. The circuit of claim 1, wherein the first and second field-effect transistors are insulated-gate field-effect transistors.

10. The circuit of claim 1, wherein the biasing circuit is connected to the gates of the first and second transistors through respective first and second bias resistors.

11. The circuit of claim 1, wherein the gate of the first transistor is coupled to the first input node through a first capacitive coupling and the gate of the second transistor is coupled to the second input node through a second capacitive coupling.

12. The circuit of claim 1, wherein the first and a second field effect transistors have matched characteristics.

13. A circuit comprising:

a peak detection circuit including a first and a second field effect transistor, each transistor having a gate coupled to a respective input node;

a biasing circuit having a bias output node connected to the gates of the first and second transistors, the biasing circuit being operative to provide a biasing voltage lower than a threshold voltage of the first and second transistors, the biasing circuit further comprising:

a third and a fourth field effect transistor, each transistor having a channel and a gate, the gates of the third and fourth field effect transistors being connected to the bias output node;

a current source operative to supply a current to the channels of the third and fourth transistors; and a comparator circuit operative to apply a voltage to the bias output node, the comparator circuit being responsive to a voltage level across the channels of the third and fourth transistors.

14. The circuit of claim 13, wherein the comparator circuit comprises a differential operational amplifier having a first amplifier input connected to a reference voltage source and a second amplifier input connected between the second current source and channels of the third and fourth transistors.

15. The circuit of claim 14, wherein the first amplifier input is an inverting input and the second amplifier input is a non-inverting input.

16. A method comprising:

charging a load capacitor;

discharging the load capacitor through a first channel of a first field effect transistor and a second channel of a second field effect transistor;

biasing a gate of the first field effect transistor and a gate of the second field effect transistor at a bias voltage below a threshold voltage of the first field effect transistor and the second field effect transistor;

applying a differential input signal at the gate of the first field effect transistor and the gate of the second field effect transistor; and low-pass filtering a voltage across the load capacitor to generate an output signal.

17. The method of claim 16, wherein the biasing comprises:

supplying a current to a channels of a third field-effect transistor and a channel of a fourth field-effect transistor;

generating a biasing voltage based on a voltage across the channels of the third and fourth transistors; and providing the biasing voltage to the gates of the first and the second field effect transistor.

18. The method of claim 17, wherein the generating of the biasing voltage comprises:

comparing the voltage across the channels of the third and fourth transistors with a reference voltage; and adjusting the biasing voltage such that the voltage across the channels of the third and fourth transistors matches the reference voltage.

19. The method of claim 18, wherein the adjusting of the biasing voltage comprises:

increasing the biasing voltage in response to a determination that the voltage across the channels of the third and fourth transistors is higher than the reference voltage; and decreasing the biasing voltage in response to a determination that the voltage across the channels of the third and fourth transistors is lower than the reference voltage.

20. The method of claim 16, wherein the input signal is a radio frequency signal.

* * * * *